(12) United States Patent
Ahn et al.

(10) Patent No.: US 7,087,515 B2
(45) Date of Patent: Aug. 8, 2006

(54) METHOD FOR FORMING FLOWABLE DIELECTRIC LAYER IN SEMICONDUCTOR DEVICE

(75) Inventors: Sang-Tae Ahn, Ichon (KR); Dong-Sun Sheen, Ichon (JP); Seok-Pyo Song, Ichon (JP)

(73) Assignee: Hynix Semiconductor Inc. (KR)

( * ) Notice: Subject to any disclaimer, the term of this patent is extended or adjusted under 35 U.S.C. 154(b) by 111 days.

(21) Appl. No.: 10/741,791

(22) Filed: Dec. 19, 2003

(65) Prior Publication Data
US 2005/0020093 A1    Jan. 27, 2005

(30) Foreign Application Priority Data
Jul. 24, 2003    (KR)  .................... 10-2003-0051127

(51) Int. Cl.
*H01L 21/02*    (2006.01)
*H01L 21/283*    (2006.01)

(52) U.S. Cl. ..................... 438/618; 438/778
(58) Field of Classification Search ................ 438/618, 438/778
See application file for complete search history.

(56) References Cited

U.S. PATENT DOCUMENTS

| | | | | |
|---|---|---|---|---|
| 6,114,259 A | * | 9/2000 | Sukharev et al. | 438/789 |
| 6,391,785 B1 | * | 5/2002 | Satta et al. | 438/704 |
| 6,649,503 B1 | * | 11/2003 | Kim et al. | 438/595 |
| 6,664,192 B1 | * | 12/2003 | Satta et al. | 438/704 |
| 6,730,570 B1 | * | 5/2004 | Shin et al. | 438/299 |
| 6,759,325 B1 | * | 7/2004 | Raaijmakers et al. | 438/633 |
| 2002/0090808 A1 | * | 7/2002 | Jeon et al. | 438/622 |
| 2003/0143839 A1 | * | 7/2003 | Raaijmakers et al. | 438/633 |

FOREIGN PATENT DOCUMENTS
KR    1020030059445    7/2003

* cited by examiner

*Primary Examiner*—Evan Pert
(74) *Attorney, Agent, or Firm*—Blakely Sokoloff Taylor & Zafman

(57) ABSTRACT

A method for forming a flowable dielectric layer using a barrier layer on sidewalls of patterned flowable dielectrics, thereby preventing a bridge phenomenon between adjacent contact plugs. The method includes steps of: forming patterns on a semiconductor substrate, wherein narrow and deep gaps are formed therebetween; forming a flowable dielectric layer so as to fill the gaps between the patterns; carrying out an annealing process for densifying the flowable dielectric layer and removing moisture therein; forming contact holes by selectively etching the flowable dielectric layer so as to expose predetermined portions of the semiconductor substrate; forming a barrier layer on sidewalls of the contact holes for preventing micro-pores in the flowable dielectric layer; carrying out a cleaning process in order to remove native oxides and defects on the semiconductor substrate; and forming contact plugs by filling a conductive material into the contact plugs.

8 Claims, 6 Drawing Sheets

METHOD FOR FORMING FLOWABLE DIELECTRIC LAYER IN SEMICONDUCTOR DEVICE

FIELD OF THE INVENTION

The present invention relates to a method for manufacturing a semiconductor device; and more particularly, to a method for forming a flowable dielectric layer by employing a barrier layer on sidewalls of the patterned flowable dielectrics.

DESCRIPTION OF THE PRIOR ART

In recent years, as semiconductor technology advances, circuit elements and interconnections on a wafer or a semiconductor substrate become increasingly denser and denser. In order to prevent unwanted interactions between these circuit elements, insulator-filled gaps or trenches located therebetween are provided to physically and electrically isolate the elements and conductive lines. However, as circuit densities continue to increase, the widths of these gaps decrease, thereby increasing gap aspect ratios, which are typically defined as the gap height divided by the gap width. As a result, it is very difficult to fill these narrow and deep gaps with a predetermined gap-fill material, which can lead to unwanted voids and discontinuities in an insulating layer. Therefore, in attempt to address this problem, there have been proposed techniques for forming the insulating layer by using a material such as a borophosphosilicate glass (BPSG), a high density plasma (HDP) oxide or the like, for improving the gap-fill property of the insulating layer.

In general, in the case of employing the BPSG as insulating material, it shows good gap-fill properties but still has a drawback that a diffusion phenomenon of the dopant in a transistor during a high thermal process may occur, i.e., a reflow process.

An HDP process has been recently used to fill high aspect ratio gaps. A typical HDP process employs chemical vapor deposition (CVD) with a gas mixture containing oxygen, silane, and inert gases such as argon, to achieve simultaneous dielectric etching and deposition. In the HDP process, an RF bias is applied to a wafer substrate in a reaction chamber. Some of these gas molecules, i.e., particularly argon, are ionized in the plasma and accelerate toward the wafer surface when the RF bias is applied to the wafer. Material is thereby sputtered when ions strike the surface. As a result, an insulating material deposited on the wafer surface is simultaneously sputter etched to help to keep the gaps open during the deposition process, which allows higher aspect ratio gaps to be filled. Although the HDP process has the aforementioned advantage for filling the high aspect ratio gaps, it suffers from shortcomings that etch damages of an underlying layer may occur due to a plasma and further, edges of a micro-pattern may be eroded while repeating the deposition and the sputter etch during the HDP process.

In attempt to overcome the above problems, therefore, another technique is proposed using a flowable dielectric for filling the narrow and deep gaps, i.e., the high aspect ratio gaps, and for protecting the underlying layer from the damage in fabricating the semiconductor device.

Referring to FIGS. 1A to 1D, there are shown cross sectional views setting forth a conventional method for forming a flowable dielectric layer 120 in a semiconductor device.

In FIG. 1A, a semiconductor substrate 110 where an active area 112 and a field area 114 are defined, is prepared in advance by a predetermined process. Thereafter, a plurality of gates 116 with narrow widths are formed on predetermined locations of a top face of the semiconductor substrate 110. Afterward, a predetermined insulating layer (not shown) is formed over the resultant structure and is anisotropically etched into a first predetermined configuration, thereby forming sidewall spacers 118 on the gates 116. Subsequently, a flowable dielectric layer 120 is formed over the resultant structure embracing the gates 116 and the sidewall spacers 118.

In an ensuing step, referring to FIG. 1B, an annealing process is carried out in a furnace for removing moisture existing in the flowable dielectric layer 120 and densifying the flowable dielectric layer 120. During the annealing process, a chemical reaction occurs in the flowable dielectric layer 120. That is, silane ($SiH_4$) and hydrogen peroxide ($H_2O_2$) inter-react in the flowable dielectric layer 120, to thereby produce Si—O bonds and O—H bonds. Therefore, O—H bonds again interact with each other to form a byproduct of water ($H_2O$) by means of a dehydration reaction. The water produced during the dehydration reaction is removed during the annealing process so that a plurality of micro-pores 115 are formed in the flowable dielectric layer 120. In particular, a top face of the flowable dielectric layer 120 is shrunk to condense the flowable dielectric layer 120 so that the micro-pores 115 are rarely formed in a top region thereof. However, since a bottom face of the flowable dielectric layer 120 is fixed to a wafer surface, a bottom region of the flowable dielectric layer 120 is hardly shrunk, whereby the micro-pores 115 are formed during the annealing process.

After carrying out the annealing process, the flowable dielectric layer 120 is planarized till top faces of the gates 116 are exposed by using a method such as chemical mechanical polishing (CMP).

In a next step, referring to FIG. 1C, contact masks (not shown) are formed on predetermined locations of the top face of the flowable dielectric layer 120. Afterward, the flowable dielectric layer 120 is patterned into a second predetermined configuration by using the contact masks as etch masks, thereby forming a plurality of contact holes 101 and patterned flowable dielectrics 120A. In FIG. 1C, it is understood that the micro-pores 115 still remain in the patterned flowable dielectrics 120A.

In a subsequent step, a pre-cleaning process is carried out for removing a natural oxide (not shown) formed after the formation of the contact holes 101, thereby securing a bottom area of the contact holes 101. While the pre-cleaning process is performed, the micro-pores 115 are enlarged gradually. That is, the micro-pores 115 formed on the sidewalls of the patterned flowable dielectrics 120A are eroded gradually by a solution for use in the pre-cleaning process. As a result, enlarged micro-pores 115A are formed on the sidewalls of the patterned flowable dielectrics 120A, as shown in FIG. 1C.

Following the pre-cleaning process, referring to FIG. 1D, a polysilicon layer is formed over the resultant structure so that the contact holes 101 are filled with the polysilicon and then, is planarized by using a method such as the CMP or an etchback process, thereby forming contact plugs 121 and 122, wherein one contact plug 121 is disposed between the gates 116 and the other contact plugs 122 are disposed aside the patterned flowable dielectrics 120A. Since the micropores 115A became enlarged during the pre-cleaning process, the polysilicon encroaches into the enlarged micropores 115A formed on the sidewalls of the patterned flowable dielectrics 120A, thereby forming rugged sidewall surfaces 126 of the conductive plugs 122 which are disposed aside the patterned flowable dielectrics 120A.

Referring to FIGS. 2A and 2B, micrographs of a scanning electron micrography (SEM) are illustrated depicting the micro-pores 115 existing in the patterned flowable dielectrics 120A and the conductive plugs 122 having the rugged sidewall surfaces 126.

In FIG. 2A, it is understood that the micro-pores 115 are formed in the patterned flowable dielectric layer 120A except the top regions of the patterned flowable dielectrics 120A, after carrying out the annealing process. That is, since the bottom regions of the patterned flowable dielectrics 120A are rarely shrunk during the annealing process, there are inevitably formed micro-pores 115 in the middle and the bottom regions of the flowable dielectric layer 120.

FIG. 2B shows the micrograph that the polysilicon encroaches into the enlarged micro-pores 115A after carrying out the pre-cleaning process and the process for forming the polysilicon layer. As aforementioned, the micro-pores 115A formed during the annealing process are enlarged during the pre-cleaning process. Therefore, the conductive plugs 122 disposed aside the patterned flowable dielectrics 120A have the rugged sidewall surface 126 encroaching into the patterned flowable dielectrics 120A so that a leakage current may be generated between adjacent contact plugs, i.e., the bridge phenomenon. Furthermore, as modern semiconductor devices are miniaturized, the polysilicon encroaching into the enlarged micro-pores 115A of the patterned flowable dielectrics 120A becomes a serious problem because modern semiconductors demand dense and miniaturized patterns. Thus, it is difficult to apply the conventional aforementioned process for forming the flowable dielectric layer to miniaturized semiconductor devices having patterns of high aspect ratios.

SUMMARY OF THE INVENTION

It is, therefore, an object of the present invention to provide a method for forming a flowable dielectric layer in a semiconductor device by forming a barrier layer on sidewalls of a patterned flowable dielectric, thereby preventing contact plugs encroaching into micro-pores in the patterned flowable dielectric.

In accordance with one aspect of the present invention, a method is provided for forming a flowable dielectric layer in a semiconductor device, the method including the steps of: a) forming a plurality of patterns on a semiconductor substrate, wherein narrow and deep gaps are formed therebetween; b) forming a flowable dielectric layer so as to fill the gaps between the patterns; c) carrying out an annealing process for densifying the flowable dielectric layer and removing moisture therein; d) forming a plurality of contact holes by selectively etching the flowable dielectric layer so as to expose predetermined portions of the semiconductor substrate; e) forming a barrier layer on sidewalls of the contact holes for preventing micro-pores in the flowable dielectric layer; f) carrying out a cleaning process in order to remove native oxides and defects on the semiconductor substrate; and g) forming a plurality of contact plugs by filling a conductive material into the contact plugs.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

FIGS. 3A to 3F illustrate cross sectional views setting forth a method for forming a flowable dielectric layer in a semiconductor device in accordance with a preferred embodiment of the present invention.

Figure 1A:
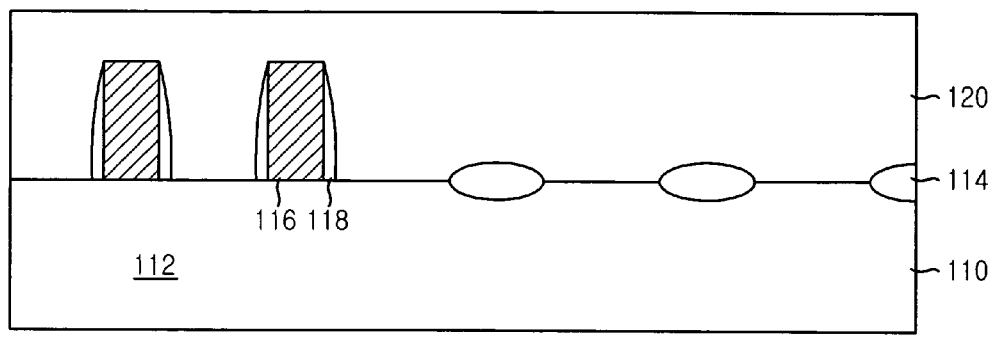
FIGS. 1A to 1D are cross sectional views setting forth a conventional method for forming a flowable dielectric layer in a semiconductor device.
Figure 1B:
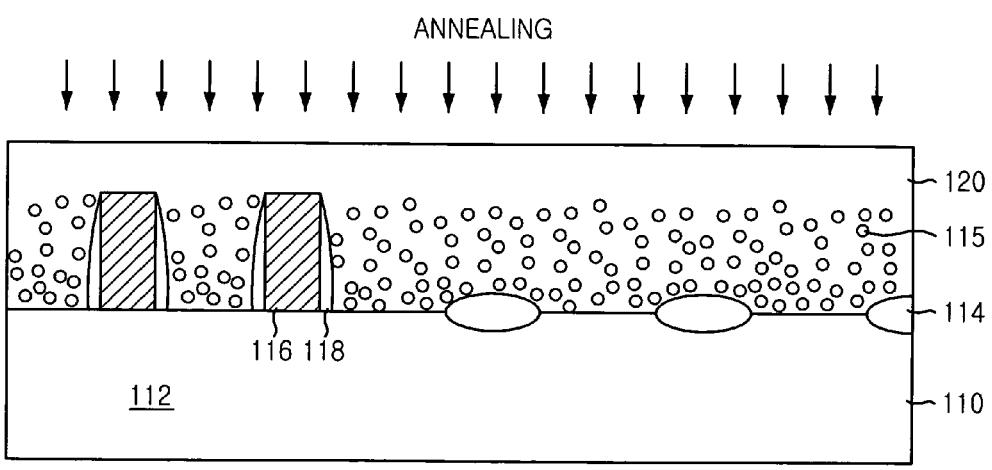
Figure 1C:
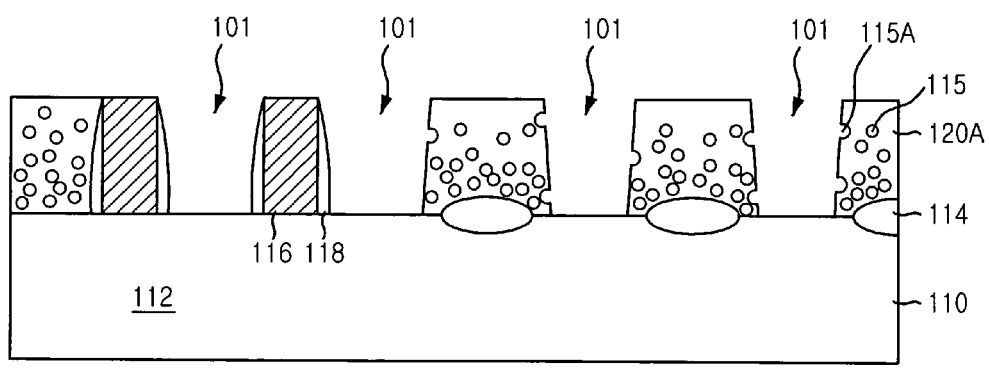
Figure 1D:
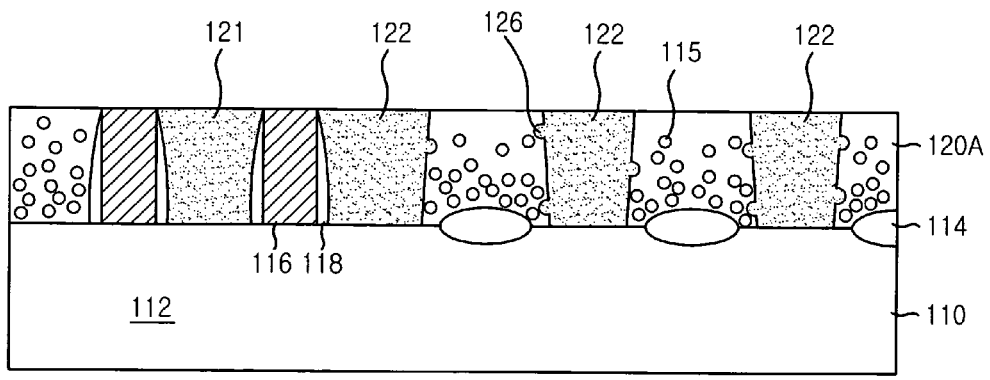
Figure 2A:
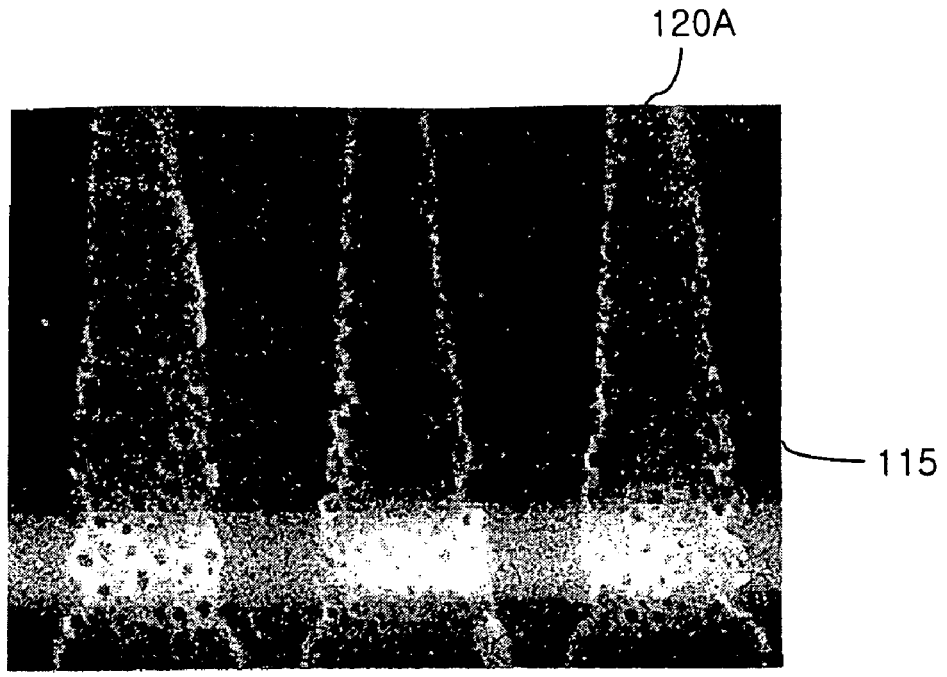
FIGS. 2A and 2B are micrographs of a scanning electron micrography (SEM) depicting the micro-pores existing in the flowable dielectric layer and the conductive plugs encroaching into the micro-pores of the flowable dielectric layer according to the conventional method.
Figure 2B:
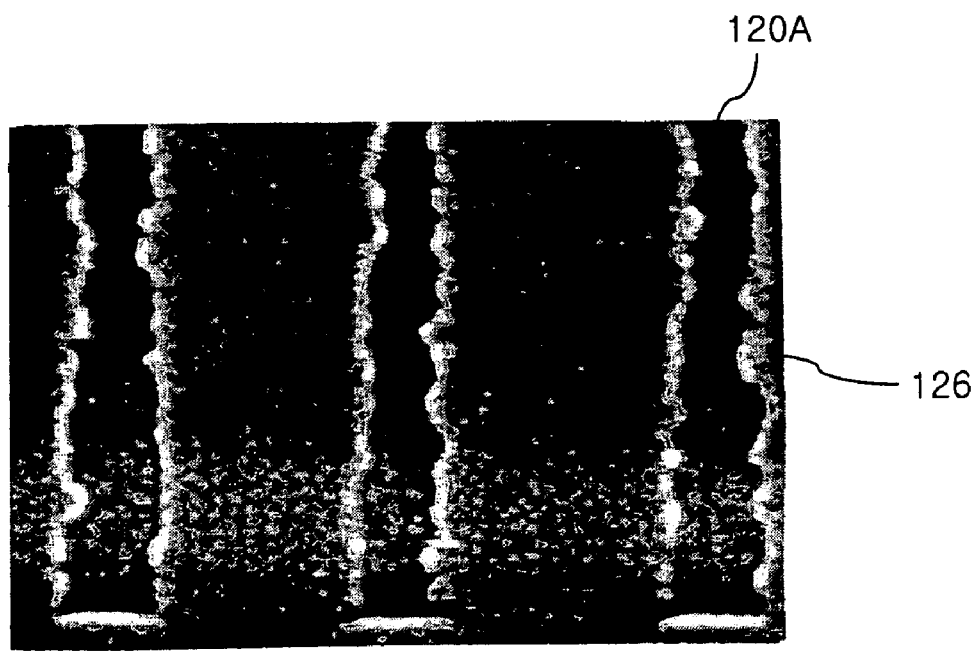
Figure 3A:
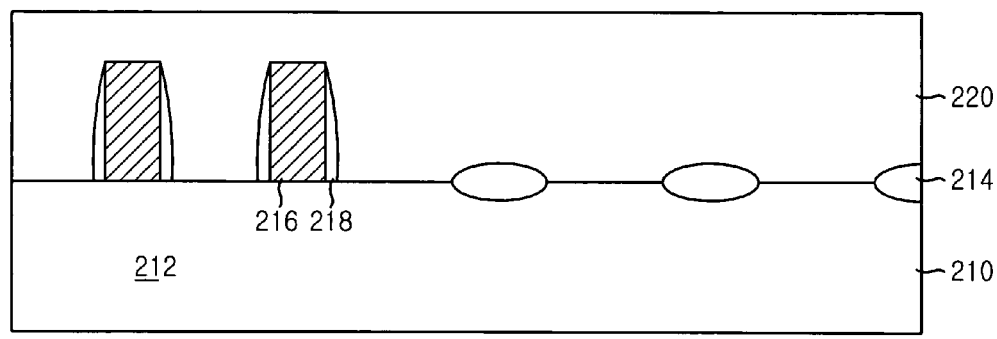
FIGS. 3A to 3F are cross sectional views setting forth a method for forming a flowable dielectric layer in a semiconductor device in accordance with a preferred embodiment of the present invention.

In FIG. 3A, an inventive method begins with preparing a semiconductor substrate 210 obtained where field oxide (FOX) areas 214 and an active area 212 are defined in preset locations of the semiconductor substrate 210 by a predetermined process. Thereafter, gates 216 are formed on predetermined locations of a top face of the semiconductor substrate 210, wherein there is formed a gap between adjacent gates 216 having a narrow space. Afterward, sidewall spacers 218 are formed on sidewalls of the gates 216 by using a typical etching process in which the sidewall spacers 218 use silicon nitride. As is well known, there are typically gate oxides (not shown) formed beneath the gates 216, and the gates 216 may be a stack structure of a polysilicon layer, a metal layer and a hard mask. Here, the metal layer and the hard mask use tungsten and nitride, respectively.

In a next step, a flowable dielectric layer 220 is formed over the resultant structure by using a spin on dielectric (SOD) such as a silicate, a siloxane, a methyl SilsesQuioxane (MSQ), a hydrogen SisesQuioxane (HSQ), an MSQ/HSQ, a perhydrosilazane (TCPS) or a polysilazane. Alternatively, the flowable dielectric layer 220 can be formed by using a low temperature undoped dielectric at a temperature in a range of about −10° C. to about 150° C. under a pressure ranging from about 10 mTorr to about 100 Torr, wherein a reaction source uses a mixture gas of $SiH_x(CH_3)_y$ ($0 \leq x \leq 4$, $0 \leq y \leq 4$), $H_2O_2$, $O_2$, $H_2O$ and $N_2O$. It is preferable that the thickness of the flowable dielectric layer 220 is in the range of about 1,000 Å to about 20,000 Å in consideration of heights of the gates 216 and a gap space between the gates 216.

Figure 3B:
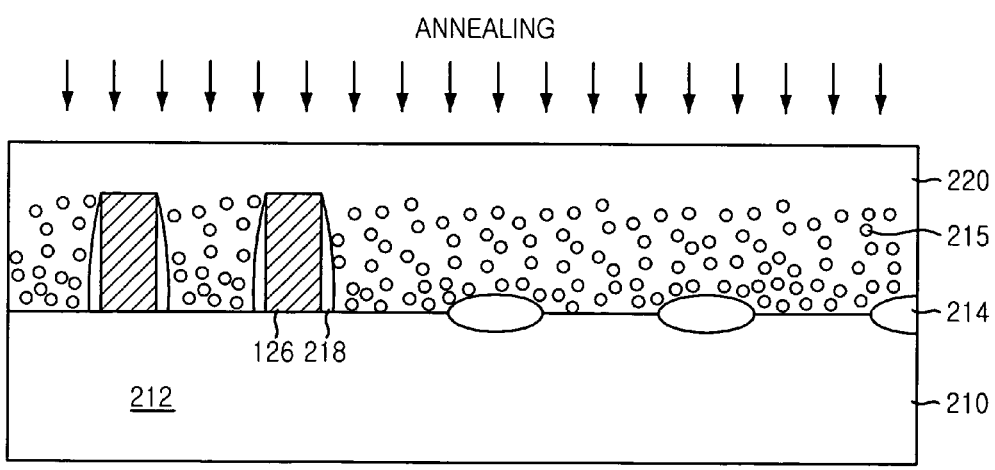

After forming the flowable dielectric layer 220, referring to FIG. 3B, an annealing process is carried out in a furnace at a temperature ranging from about 300° C. to about 1,000° C., for densifying the flowable dielectric layer 220 and for removing moisture therein. During the annealing process, there a plurality of micro-pores 215 are formed in the flowable dielectric layer 220. In detail, during the annealing process, a chemical reaction occurs in the flowable dielectric layer 220. That is, silane ($SiH_4$) and hydrogen peroxide ($H_2O_2$) interact in the flowable dielectric layer 220, to thereby produce Si—O bonds and O—H bonds. Therefore, O—H bonds again interact with each other to form a byproduct of water ($H_2O$) by means of a dehydration reaction. The water produced during the dehydration reaction is removed during the annealing process so that a plurality of micro-pores 215 are formed in the flowable dielectric layer 220. In particular, a top face of the flowable dielectric layer 220 is shrunk to condense the flowable dielectric layer 120 so that the micro-pores 215 are rarely formed in a top region thereof. However, since a bottom face of the flowable dielectric layer 220 is fixed to a wafer surface, a bottom region of the flowable dielectric layer 220 is hardly shrunk, whereby the micro-pores 215 are formed during the annealing process.

Afterward, the flowable dielectric layer 220 is planarized until the top faces of the gates 216 are exposed by using the CMP process. The reason of carrying out the planarization process before forming contact holes 201 is to secure a wider area in a bottom region of the contact holes 201 because an etch profile is slightly inclined toward the bottom faces of the contact holes 201.

Figure 3C:
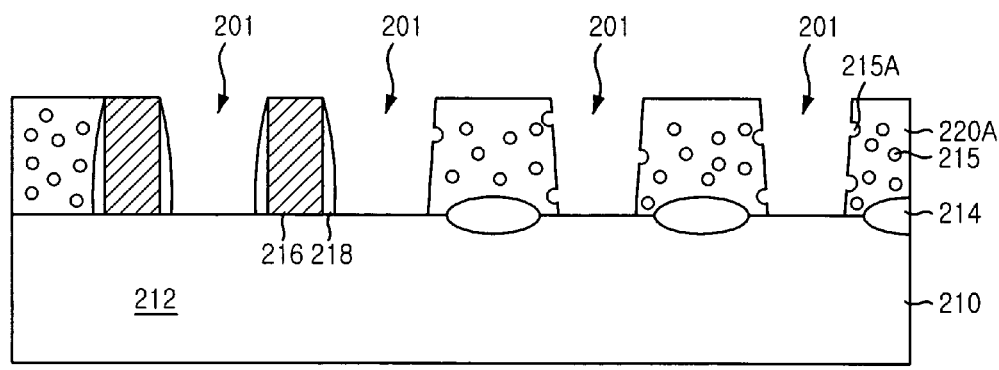

Subsequently, referring to FIG. 3C, preset contact masks (not shown) are formed on predetermined locations of the top face of the planarized flowable dielectric layer 220. Afterward, the planarized flowable dielectric layer 220 is patterned into a predetermined configuration by using the preset contact masks so as to form the contact holes 201 and patterned flowable dielectrics 220A.

Following the formation of the contact holes 201, a pre-cleaning process is carried out for removing a native oxide and defects formed on the semiconductor substrate 210 by using a method such as a wet cleaning or a dry cleaning process. Therefore, it is possible to secure bottom areas of the contact holes 201 without the native oxide and the defects. Like the prior art, the micro-pores 215 on the sidewalls of the patterned flowable dielectrics 220A are gradually enlarged during the pre-cleaning process, thereby forming enlarged micro-pores 215A.

Figure 3D:
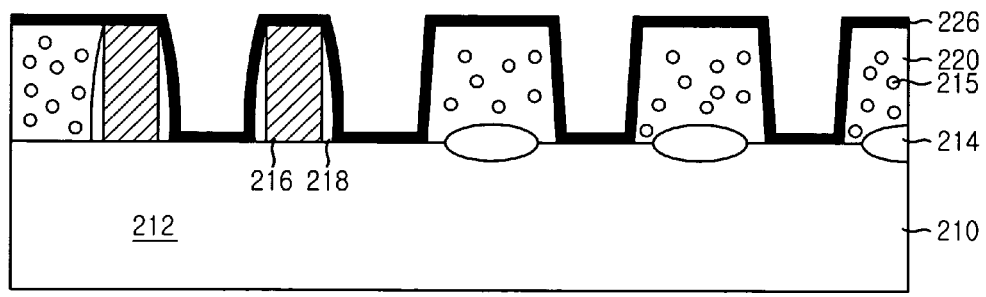

Thereafter, referring to FIG. 3D, a barrier layer 226 is formed on bottom faces and sidewalls of the patterned flowable dielectrics 220A and the bottom faces of the contact holes 201 with a thickness in the range of about 20 Å to about 300 Å for preventing a gas or a solution infiltrating into the micro-pores in the patterned flowable dielectrics 220A. Herein, the barrier layer 226 uses a material such as a silicon nitride, a silicon oxide, a silicon carbide or the like.

Figure 3E:
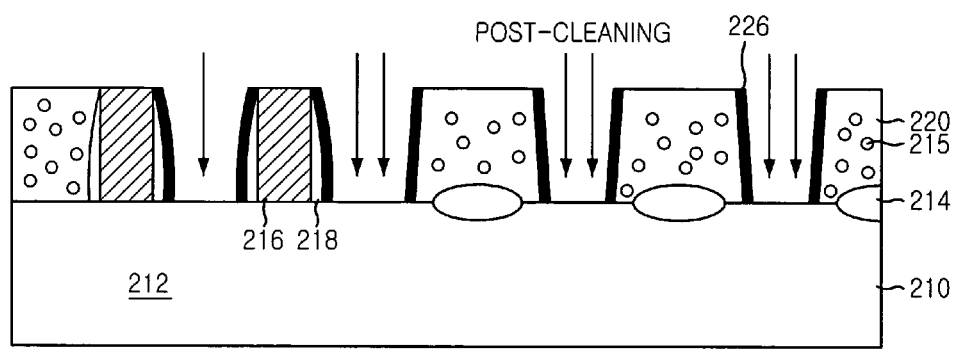

After the formation of the barrier layer 226, referring to FIG. 3E, portions of the barrier layer 226 formed on the top faces of the patterned flowable dielectrics 220A and the bottom faces of the contact holes 201 are removed by using a dry etching process, e.g., a blanket etch process. Therefore, the barrier layer 216 exists only on the sidewalls of the patterned flowable dielectrics 220A. Thereafter, a post-cleaning process is carried out for removing another native oxide and defects formed on the semiconductor substrate 210 by using a method such as a wet cleaning or a dry cleaning process. In the present invention, the barrier layer 226 is introduced before forming contact plugs 221 and 222. Therefore, it is possible to prevent the micro-pores existing on the sidewalls of the patterned flowable dielectrics 220A being enlarged during the post-cleaning process. Accordingly, the polysilicon in the contact plugs 221 and 222 does not encroach into the enlarged micro-pores 115A of the patterned flowable dielectrics 220A so that a bridge between the adjacent contact plugs 221 and 222 can not be generated.

Figure 3F:
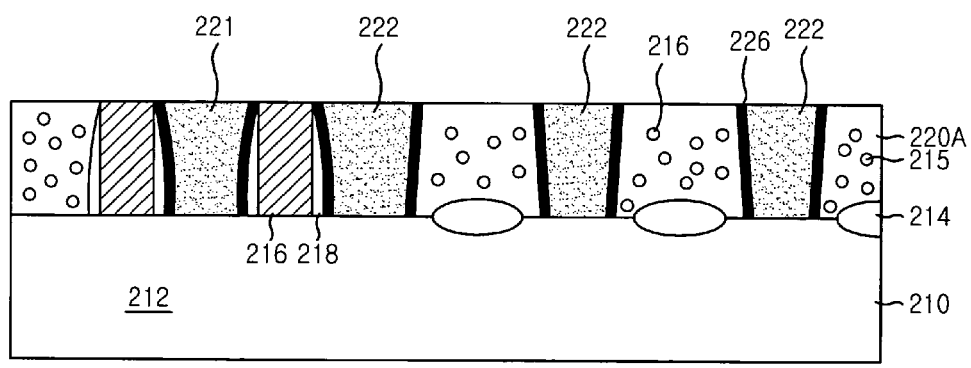

Afterward, referring to FIG. 3F, a conductive layer such as polysilicon is deposited over the resultant structure and is planarized by using a method such as the CMP process or an etchback process, thereby forming the contact plugs 221 and 222. Among the contact plugs 221 and 222, one of the contact plugs 222 serves as a storage node contact plug and the other contact plug 221 serves as a bit line contact.

As described above, in comparison with the prior art method, the barrier layer 226 is formed on the sidewalls of the patterned flowable dielectrics 220A before carrying out a post-cleaning process. Therefore, the polysilicon in the contact plugs 221 and 222 can not diffuse into the micro-pores in the patterned flowable dielectrics 220A. As a result, the bridge phenomenon between adjacent contact plugs 221 and 222, which is a serious problem in the prior art method, is effectively prevented.

Furthermore, the formation of the flowable dielectric layer 220 is carried out at a low temperature, thereby preventing the diffusion of the dopant in a transistor. Additionally, since the barrier layer 226 is employed before the process for forming contact plugs 221 and 222, it is possible to secure a cleaning process margin, to thereby enhance a contact resistance and remove defects existing in a wafer produced during the etch process easily.

While the present invention has been described with respect to the particular embodiments, it will be apparent to those skilled in the art that various changes and modifications may be made without departing from the scope of the invention as defined in the following claims.

What is claimed is:

1. A method for forming a flowable dielectric layer in a semiconductor device, the method comprising the steps of:
 a) forming a plurality of patterns on a semiconductor substrate, wherein narrow and deep gaps are formed therebetween;
 b) forming a flowable dielectric layer to fill the gaps between the patterns wherein step b) is carried out at a temperature in a range of about −10° C.—to about 150° C. under a pressure ranging from about 10 mTorr to about 100 Torr, wherein a reaction source uses a mixture gas of $SiH_x(CH_3)_y$ ($0 \leq x \leq 4$, $0 \leq y \leq 4$), $H_2O_2$, $O_2$, $H_2O$ and $N_2O$;
 c) carrying out an annealing process for densifying the flowable dielectric layer and removing moisture therein;
 d) forming a plurality of contact holes by selectively etching the flowable dielectric layer so as to expose predetermined portions of the semiconductor substrate;
 e) forming a barrier layer on sidewalls of the contact holes for preventing micro-pores in the flowable dielectric layer;
 f) carrying out a cleaning process in order to remove native oxides and defects on the semiconductor substrate; and
 g) forming a plurality of contact plugs by filling a conductive material into the contact plugs.

2. The method as recited in claim 1, wherein the step e) includes the steps of:
 e1) forming an insulating layer over the resultant structure; and
 e2) carrying out a dry etching so as to form spacers on the sidewalls of the contact holes.

3. The method as recited in claim 2, wherein the step e2) is carried out by using a blanket etch process.

4. The method as recited in claim 1, wherein the barrier layer employs a material selected from the group consisting of a silicon oxide, a silicon nitride and a silicon carbide.

5. The method as recited in claim 1, wherein the barrier layer is formed with a thickness in a range of about 20 Å to about 300 Å.

6. The method as recited in claim 1, after the step d), further comprising the step of carrying out a pre-cleaning process for removing native oxides and the other impurities.

7. The method as recited in claim 1, wherein the step c) is carried out in a furnace at a temperature in a range of about 300° C.—to about 1,000° C.—.

8. The method as recited in claim 1, wherein the step b0 is carried out by using a spin on dielectric (SOD) selected from the group consisting of a silicate, a siloxane, a methyl SilsesQuioxane (MSQ), a hydrogen SisesQuioxane (HSQ), an MSQ/HSQ, a perhydrosilazane (TCPS) or a polysilazane.

* * * * *